United States Patent [19]

Lin

[11] Patent Number: 5,378,657
[45] Date of Patent: Jan. 3, 1995

[54] METHOD FOR MAKING AN ALUMINUM CLAD LEADFRAME AND A SEMICONDUCTOR DEVICE EMPLOYING THE SAME

[75] Inventor: Paul T. Lin, Austin, Tex.

[73] Assignee: Motorola, Inc., Schaumburg, Ill.

[21] Appl. No.: 205,424

[22] Filed: Mar. 4, 1994

Related U.S. Application Data

[62] Division of Ser. No. 100,943, Aug. 3, 1993, Pat. No. 5,329,159.

[51] Int. Cl.6 ............................................. H01L 21/60
[52] U.S. Cl. .................................. 437/217; 437/206; 437/209; 437/220
[58] Field of Search ............... 437/206, 209, 214, 215, 437/217, 219, 220

[56] References Cited

U.S. PATENT DOCUMENTS

| | | |
|---|---|---|
| 4,554,404 | 11/1985 | Gilder, Jr. et al. |
| 4,651,415 | 3/1987 | Frampton. |
| 4,805,009 | 2/1989 | Pryor et al. ............. 257/677 |
| 4,820,658 | 4/1989 | Gilder, Jr. et al. ........ 437/409 |
| 4,872,260 | 10/1989 | Johnson et al. |
| 4,951,119 | 8/1990 | Yonemochi et al. |
| 5,041,395 | 8/1991 | Steffen .................. 437/217 |
| 5,205,036 | 4/1993 | Yamazaki ............... 437/217 |
| 5,278,101 | 1/1994 | Ikenoue ................. 437/217 |

FOREIGN PATENT DOCUMENTS

| | | | |
|---|---|---|---|
| 1-5049 | 1/1989 | Japan ................. 257/677 |
| 3-50856 | 3/1991 | Japan ................. 257/677 |
| 2173342 | 10/1986 | United Kingdom . |

Primary Examiner—Brian E. Hearn
Assistant Examiner—Kevin M. Picardat
Attorney, Agent, or Firm—Minh-Hien N. Clark

[57] ABSTRACT

A quad leadframe (22') for a CERQUAD is manufactured using conventional cladding and stamping technologies. A first metal layer (12) is provided with multiple cavities (14). A second metal layer (14) is clad to the first metal layer. A leadframe strip (22) can then be stamped from the clad metal. The leadframe has a leads (24) and bonding posts (28). The leads comprise two metal layers, and the bonding posts comprise only the second metal layer. The leadframe can then be used in the assembly of a semiconductor device (32). The portion of the leads external to the package body can be optionally etched to remove the second metal layer.

16 Claims, 2 Drawing Sheets

METHOD FOR MAKING AN ALUMINUM CLAD LEADFRAME AND A SEMICONDUCTOR DEVICE EMPLOYING THE SAME

This is a divisional of application Ser. No. 08/100,943, filed Aug. 3, 1993, now U.S. Pat. No. 5,329,159.

CROSS-REFERENCE TO RELATED APPLICATIONS

Related subject matter is disclosed in U.S. patent application by Truoc T. Tran et al., entitled "Method for Making a Quad Leadframe for a Semiconductor Device and Method for Making a Semiconductor Device Using Said Leadframe," filed on Jul. 6, 1993, Ser. No. 08/088,689, and assigned to the assignee hereof.

FIELD OF THE INVENTION

The field of the invention relates to a method for making a leadframe for a semiconductor device, and a semiconductor device employing said leadframe generally, and more specifically to a method for making an aluminum clad quad leadframe, and a semiconductor device employing the same.

BACKGROUND OF THE INVENTION

Currently, the cost of manufacturing aluminized leadframes for a ceramic quad (CERQUAD) package is high due to the cost of aluminization. The current method for making a CERQUAD leadframe involves etching or stamping a bare Alloy 42 leadframe. Each leadframe is then aluminized either through an electron beam evaporation process (EBEP) or through an ion plating process (IPP). The aluminum is necessary to promote adhesion at the lead tips for the aluminum wire bonds that are used with a ceramic package. Either of these two processes are very, costly in addition to being very slow. The fact that each CERQUAD leadframe must be individually aluminized translates into a long cycle time for making the CERQUAD leadframe. Furthermore, the cost of aluminizing the lead tips or a portion of the leads of a CERQUAD leadframe accounts for approximately two-thirds of the cost of a CERQUAD leadframe due to the EBEP or IPP process. Although a stamped leadframe traditionally costs less per leadframe as compared to an etched lead frame, the initial investment in a stamping tool is high, so the volume of leadframes produced per stamping tool must be very high to make the stamping tool cost effective. However, in the case of a CERQUAD leadframe, the price difference between an etched and a stamped bare Alloy 42 leadframe is negligible when compared to the aluminization cost of the lead tips. Therefore, an alternative quad leadframe having aluminized lead tips but low in manufacturing cost is desirable.

SUMMARY OF THE INVENTION

The invention provides, in one embodiment, a clad leadframe comprising two metal layers. The clad leadframe has a plurality of leads and a plurality of bonding posts. The plurality of leads have proximal ends to a central cavity for accommodating a semiconductor die and are composed of a first metal layer. The plurality of bonding posts are composed of a second metal layer which is clad on one surface of the first metal layer. The plurality of bonding posts extend beyond the proximal ends of the plurality of leads of the first metal layer toward the central cavity.

The invention provides, in another embodiment, a semiconductor device employing the clad leadframe of the invention. A semiconductor die having an active surface is mounted in a central die receiving area of a base member. A clad leadframe of the invention, as described above, is bonded to a periphery of the base member with a first seal, such that the plurality of leads and the plurality of bonding posts converge toward the central die receiving area, wherein a portion of the clad leadframe extends beyond the periphery of the base member. A plurality of wire bonds connect the active surface of the semiconductor die to the plurality of bonding posts. A cover member which mates to the base member to form a package body around the semiconductor die and the plurality of wire bonds is bonded to the base member with a second seal. The portion of the clad leadframe which extends beyond the periphery of the base member is external to the package body, and is formed such that the first metal layer provides a surface for solder connections.

The invention provides, in another form, a method for making a clad leadframe comprising two metal layers. A first metal layer is provided with a first central cavity in the metal layer. A second metal layer is clad to a surface of the first metal layer. The second metal layer covers at least a portion of the first central cavity in the first metal layer. A plurality of leads are formed in the first and second metal layers, wherein the plurality of leads have distal and proximal ends to the first central cavity. A plurality of bonding posts are formed from the second metal layer by forming a second central cavity in the second metal layer, wherein the second central cavity is concentric to and is smaller than the first central cavity. The plurality of bonding posts extend beyond the proximal ends of the plurality of leads.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

BRIEF DESCRIPTION OF THE DRAWINGS

FIGS. 1–4 incorporate many of the same or similar elements. Therefore, like reference numerals designate identical or substantially corresponding parts throughout the several views.

DETAILED DESCRIPTION OF A PREFERRED EMBODIMENT

Figure 1:
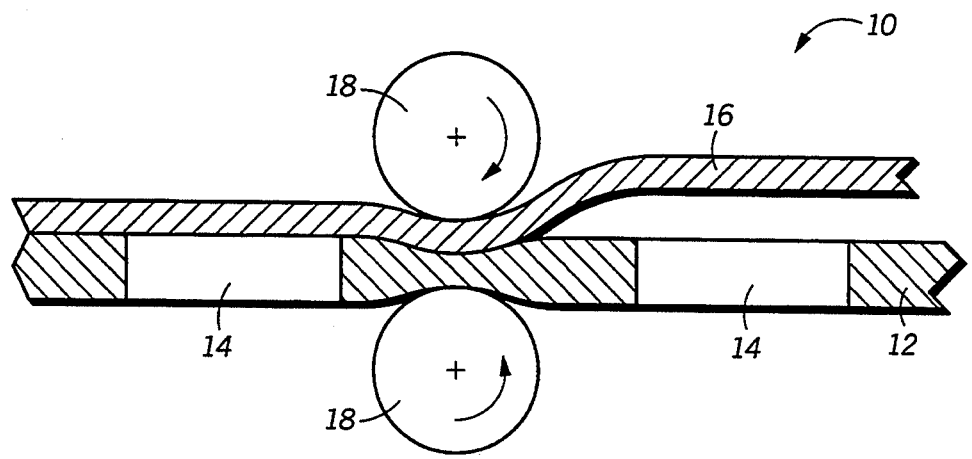
FIG. 1 illustrates, in cross-section, a cladding process in accordance with an embodiment of the invention.

Illustrated in FIG. 1 is a cross-sectional view of a cladding process 10, in accordance with an embodiment of the invention. A first metal layer 12 is provided with a plurality of cavities 14. The thickness of the first metal layer 12 is preferably 4 to 6 mils (0.10 to 0.15 mm). The plurality of cavities 14 may be either etched or stamped in the first metal layer 12. The relative distance between the cavities 14 depend on the size desired for the leadframes to be formed from the metal layer. Thus, a large leadframe for a large semiconductor device requires more spacing between the cavities than a small leadframe. The actual distance varies for each size of leadframe to be manufactured. A second metal layer 16 is clad to the first metal layer 12. The cladding is typically accomplished by using rollers 18 which exert pressure on the two metal layers and laminate them together through pressure bonding. The resulting clad strip may be annealed to form a solid-solution weld. The thickness of the second metal layer 16 is preferably 2 to 6 mils (0.05 to 0.15 mm).

The cladding process involves thickness reduction and causes unidirectional elongation along the rolling direction. Therefore, one should compensate for this unidirectional elongation at the design level. For example, if the cladding process results in a five percent elongation, one should design the cavity in the first metal with a five percent corresponding shortage in the rolling direction. Thus, if the desired cavity is 20 mm×20 mm, one should provide a cavity of 19 mm×20 mm before the cladding process, so that after cladding, the resulting cavity has elongated to 20 mm×20 mm. Furthermore, it is envisioned that the cladding process is performed in strip form. Hence, the strip indexing holes (not shown) should be positioned with respect to the center of the cavity. Optical recognition of cavities after cladding is a practical way to calculate and position the indexing holes on the strip for all subsequent stamping;, etching, as well as assembly processes.

The second metal layer 16 may be a solid layer as illustrated, or it may also have cavities similar to the first metal layer 12. However, if the second metal layer has cavities, they must be smaller than the cavities 14 in the first metal layer such that a portion of the cavities 14 are covered with the second metal layer. It should also be obvious that the cavities in the second metal layer must also align to the cavities in the first metal layer. Thus, it is preferable to use a solid metal layer for the second layer to eliminate the alignment requirement.

The first metal layer is preferably a nickel-iron alloy, such as Alloy 42, or a nickel-cobalt-iron alloy, such as Kovar. However, the first metal layer is not limited to those metals. Other metals which may be used include copper, iron, tin, chromium, alloys thereof, and even stainless steel. Thus, the invention is not intended to be limited to any specific metal or metal alloy. The second metal layer is preferable aluminum or an aluminum alloy. The reason why aluminum is preferred is that the leadframe of the present invention is targeted for a CERQUAD package which requires aluminized lead tips for wire bond reliability. However, the present invention can be used to manufacture leadframes composed of two metal layers for different applications which may not require aluminum but another metal at the tips. Thus, the second metal layer may be of another metal such as copper or silver or alloys thereof.

Figure 2:
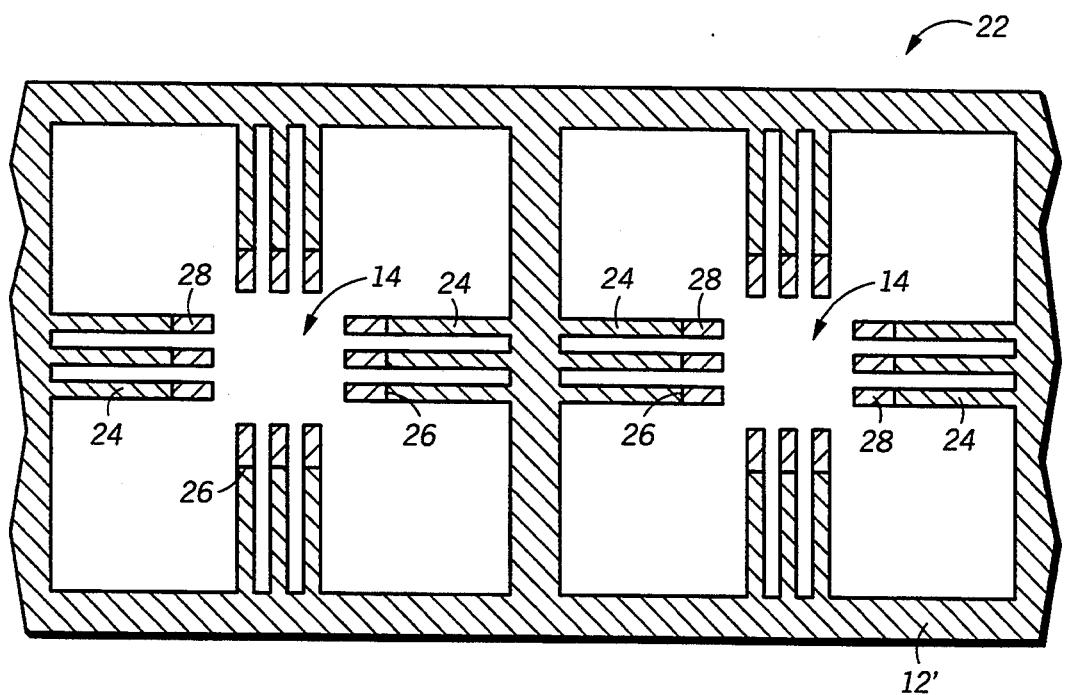
FIG. 2 illustrates, in a bottom view, a quad leadframe using the clad metal of FIG. 1, in accordance with an embodiment of the invention.

After the step of cladding, a quad leadframe can be made from the clad metals. FIG. 2 illustrates, in a bottom view, a partial leadframe strip 22 manufactured from the two metal layers of FIG. 1. It should be understood that the leadframes illustrated are greatly simplified for ease of illustration, and that actual leadframe designs are much more detailed. A plurality of leads 24 are formed in the two metal layers. The leads 24 have a quad configuration for use with a CERQUAD type package. The leads 24 have proximal ends 26 to central cavities 14, which correspond to the cavities 14 in the first metal layer of FIG. 1. The central cavities 14 are there to accommodate semiconductor dice (not shown), and thus would vary in size depending on the size of the semiconductor dice.

A plurality of bonding posts 28 are formed from the second metal layer by forming a second central cavity which is concentric to but smaller than the first central cavity 14. Thus, the plurality, of bonding posts 28 extend beyond the proximal ends 26 of the leads 24. The second central cavity may be formed by either etching or stamping through the second metal layer. One advantage of stamping is that a single stamping process can be performed to form the plurality of leads, the second central cavity, and thus the plurality of bonding posts.

It should be understood that the entire leadframe is composed of two metal layers, except the bonding posts, which are composed of only the second metal layer. Thus, the bonding posts are thinner than the remainder of the leadframe. An advantage of having single metal layer bonding posts is that finer geometries are achievable. Typically, dense pitch is required at the inner leads or bonding posts, so fine stamping can be easily accomplished on only the thin cladding material (second metal layer). The remainder of the leadframe including the portion of the leads which would be external to a package body have the combined thicknesses of the first and second metal layers. It is advantageous to have thicker external leads to minimize lead damage during handling and mounting of devices.

Cladding is a well-known process in the art. However, cladding a solid metal layer to another metal layer having pre-formed cavities corresponding to a leadframe design is new. Moreover, the resulting clad leadframe structure is unique because the bonding posts are composed of the cladding layer only. The aluminum clad leadframe of the present invention is quite different from aluminized lead frames of the prior art. As mentioned previously, the current practice of aluminizing lead tips for CERQUAD leadframes requires the use of either EBEP or IPP. The aluminized lead tips of the prior art are composed of two metals, aluminum on a base metal, and the remaining portion of the leadframe is composed of only the base metal, which is the opposite of the present invention. The aluminum clad leadframe of the present invention eliminates the need for either EBEP or IPP; and the cladding process is much cheaper than either EBEP or IPP.

Figure 3:
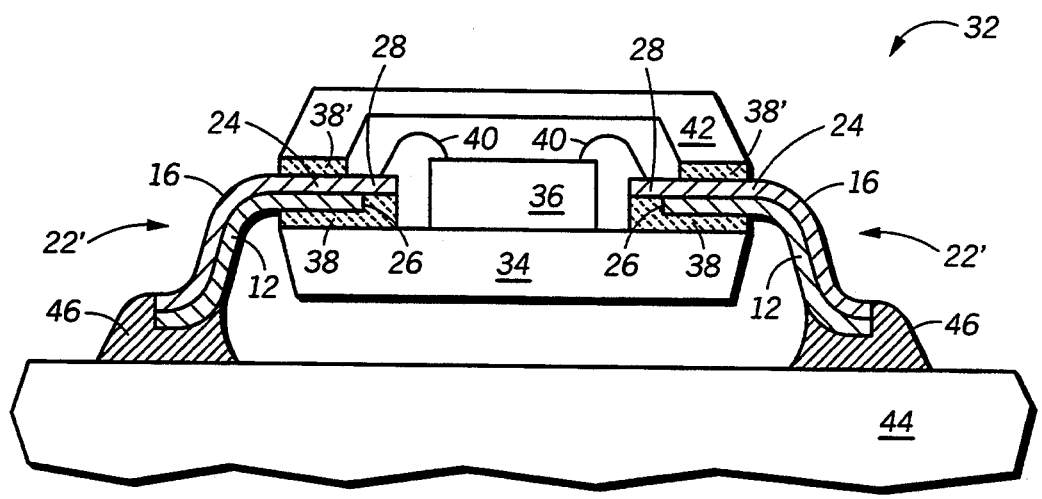
FIG. 3 illustrates, in cross-section, a semiconductor device employing the quad leadframe of FIG. 2, in accordance with an embodiment of the invention.

FIG. 3 illustrates, in cross-section, a semiconductor device 32 employing the clad leadframe of the present invention. As illustrated, device 32 has a base member 34 upon which a semiconductor die 36 is mounted. The base member 34 is depicted as having a flat surface for a die receiving area. However, it is also possible to have a recess or cavity in the base member for a die receiving area. Base member 34 can be a ceramic or a metal for hermetic applications. Ceramic composite and metal composite materials may also be used for the base member.

A single leadframe 22', which corresponds to one unit from the leadframe strip 22 of FIG. 2, is bonded to a periphery of the base member 34 with a seal material 38.

The seal material 38 is typically a glass seal for CERQUAD type packages. A glass embedding process associated with ceramic packaging is well known in the art. However, if hermeticity is not a requirement, another type of seal, such as epoxy or silicone resin adhesives, may also be used to bond the leadframe 22' to the base member. The plurality of leads 24 extend toward the semiconductor die 36, with the plurality of bonding posts 28 being closest to the semiconductor die. A plurality of wire bonds 40 connect bonding pads (not shown) on the active surface of the semiconductor die to the bonding posts. Wire bonds 40 are typically aluminum or aluminum alloy for CERQUAD packages. If the bonding posts are formed from another metal other than aluminum, it may be desirable to use gold or copper wire bonds, depending on the metal cladding. Methods of wire bonding are well known in the art.

A cover member 42 mates with the base member 34 to form a protective package body around the semiconductor die 36 and the plurality of wire bonds 40. Cover member 42 can be a ceramic or a metal for hermetic applications. Ceramic composite and metal composite materials may also be used for the cover member. Generally, it is desirable to match the thermal expansion coefficients of the base member to the cover member to reduce package stress. A glass seal 38' seals the cover member 42 to the base member 34 and to the leadframe 22'. Seal 38' may be another type of material, such as epoxy or silicone resin adhesives, if hermeticity is not a requirement for the device.

As illustrated in FIG. 3, the portion of the leadframe that is external to the package body is formed into a gull-wing lead configuration. The entire length of the leads have the aluminum cladding on one surface. An advantage with this configuration is that the low inductance skin conduction of the aluminum layer provides significant electrical improvement for the device, especially for high frequency devices, such as those beyond the 50 megahertz range. The external leads are formed such that the first metal layer provides a surface for subsequent solder connections. Typically, the external leads of a semiconductor device are plated with tin or lead or an alloy thereof to promote adhesion of the leads when the device is mounted to a board 44. Aluminum does not plate well with tin or lead, thus during board mounting, the solder paste 46 only wets to the first metal layer which has been plated. Therefore, it is critical that the leads are formed with the first metal layer in a position to be soldered to a board. The second metal layer, which is the cladding, should be facing away from the board.

If aluminum on the external leads is not desired, then the aluminum cladding may be etched away after the cover member is sealed to the base member. The etching solution used should dissolve the cladding metal layer 16 but not significantly impact the seal 38 and 38'. Examples of possible etchants include, but are in no way limited to, diluted hot HCl, HNO$_3$, and KOH. After the cladding metal layer is removed, the external leads can be plated as any conventional CERQUAD type package. All exposed surfaces of the external leads will plate, so it is not necessary to form the leads in any particular direction because solder wetting, or lack thereof, will not be a factor during board mounting.

Figure 4:
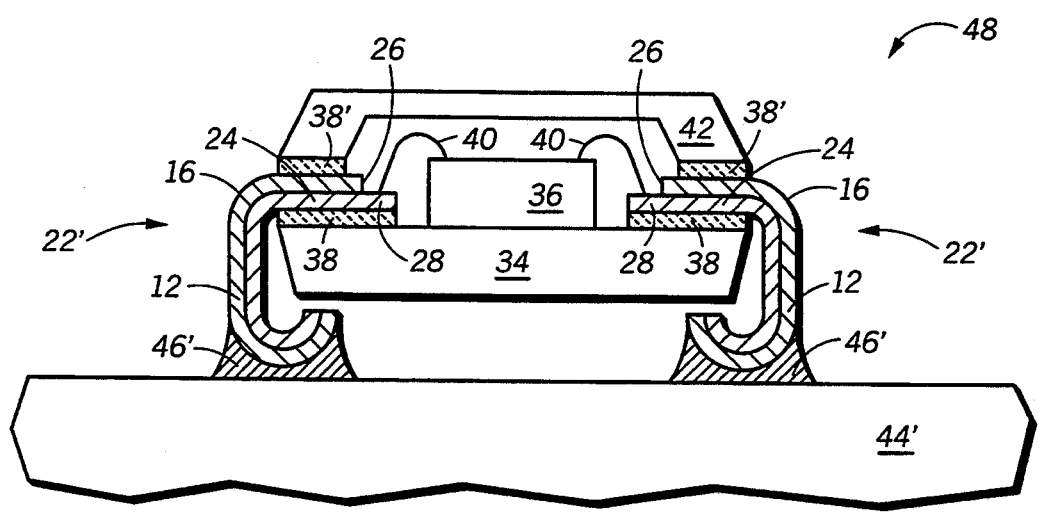
FIG. 4 illustrates, in cross-section, a J-leaded semiconductor device employing the quad leadframe of FIG. 2, in accordance with an alternative embodiment of the invention.

FIG. 4 illustrates, in cross-section, a J-leaded semiconductor device 48 in an alternative embodiment of the present invention. Device 48 is substantially the same as device 32 of FIG. 3. However, in this alternative embodiment, the leadframe 22' is invertedly bonded to the base member 34, so that the first metal layer is further away from the base member than the second metal layer. The bonding posts 28 remain exposed for wire bonding. The external leads of device 48 are formed into a J-leaded configuration. It is critical that the first metal layer 12 be formed in a position to be soldered to a board 44'. Again, it is possible to etch the cladding (second) metal layer away so that only the first metal layer remains so that the entire external leads would plate. In that case, the direction of lead forming is not critical.

The foregoing description and illustrations contained herein demonstrate many of the advantages associated with the present invention. In particular, a cost effective quad leadframe having aluminum lead tips, a method for its fabrication, and a semiconductor device employing said leadframe have been revealed. The manufacturing of such a leadframe utilizes conventional cladding and stamping technology to produce a quad leadframe composed of two metal layers. The bonding posts are composed of a single metal layer which allows denser pitch to be easily stamped. Another advantage is that the present invention eliminates the need for more costly aluminizing techniques such as EBEP or IPP. Furthermore, stamping of the leadframes becomes a cost effective method of producing high volumes of the leadframes because of the elimination of the EBEP and IPP processes. The semiconductor device employing the leadframe of the present invention can be hermetic. Additionally, the leadframe is geared for surface mount semiconductor devices which are more desirable in today's applications.

Thus it is apparent that there has been provided, in accordance with the invention, a quad leadframe having aluminum lead tips, a method for its fabrication, and a semiconductor device using said quad leadframe that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the base member and cover member may be of a material other than ceramic, metal, or a composite thereof. The base and cover member may be premolded plastic members which can be used to make non-hermetic devices. Furthermore, the leadframe configuration is not limited to what has been illustrated since leadframe design varies for different semiconductor devices. In addition, the invention is not limited in any way to any specific type of semiconductor devices. Furthermore, the device may be either in a die up (as illustrated) or die down configuration. In a die down configuration, the leadframe would be invertedly bonded to the base member, and the external leads would be formed toward the cover member in a gull-wing-like configuration. Alternatively, the leadframe could be bonded to the base member in a straight forward manner, and the external leads would be formed toward the cover member in a J-leaded configuration. The only criticality in external lead formation is that the first metal layer be formed in a position to be soldered to a board if the cladding layer is not removed from the external lead portion. Therefore, it is intended that this invention encompass all such variations and modifications falling within the scope of the appended claims.

What is claimed is:

1. A method for making a clad leadframe, comprising the steps of:
    providing a first metal layer having a first central cavity;
    cladding a second metal layer to a surface of the first metal layer, wherein the second metal layer covers at least a portion of the first central cavity in the first metal layer;
    forming a plurality of leads in the first and second metal layers, wherein the plurality of leads have distal and proximal ends to the first central cavity; and
    forming a plurality of bonding posts from the second metal layer by forming a second central cavity in the second metal layer, the second central cavity being concentric to the and smaller than the first central cavity, such that the plurality of bonding posts extend beyond the proximal ends of the plurality of leads.

2. The method according to claim 1, wherein the step of cladding comprises rolling a solid second metal layer onto a surface of the first metal layer.

3. The method according to claim 1, wherein the step of providing a first metal layer comprises providing a nickel-iron alloy, and the step of cladding a second metal layer comprises cladding an aluminum layer.

4. The method according to claim 1, wherein the step of forming the plurality of leads and the step of forming a second central cavity are performed with a stamping tool.

5. The method of claim 1, whereinwherein the step of providing a first metal layer comprises providing a material selected from a group consisting of: nickel, iron, cobalt, copper, tin, chromium, and an alloy thereof.

6. The method of claim 1, wherein the step of cladding a second metal layer comprises cladding a material selected from a group consisting of: aluminum cladding, copper cladding, silver cladding, and an alloy cladding thereof.

7. A method for making a semiconductor device, comprising the steps of:
    providing a clad lead frame which comprises:
        a plurality of leads composed of a first metal layer, the plurality of leads having proximal ends to a central cavity for accommodating a semiconductor die; and
        a plurality of bonding posts composed of a second metal layer which is clad on one surface of the first metal layer, wherein the plurality of bonding posts extends beyond the proximal ends of the plurality of leads of the first metal layer toward the central cavity;
    bonding a first portion of the clad leadframe to a periphery of a base member using a first seal, such that the plurality of leads and the plurality of bonding posts converge toward a central die receiving area on the base member, wherein a second portion of the clad leadframe extends beyond the periphery of the base member;
    mounting a semiconductor die to the base member in the central die receiving area;
    electrically connecting the semiconductor die to the plurality of bonding posts; and
    sealing a cover member to the base member with a second seal to form a package body around the semiconductor die.

8. The method of claim 7, further comprising the steps of:
    forming the second portion of the clad leadframe into a plurality of external leads;
    removing any portion of the second metal layer which is external to the package body; and
    plating the external leads after the step of removing.

9. The method of claim 8, wherein the step of removing comprises etching the second metal layer away from the second portion of the clad leadframe.

10. The method of claim 7, wherein the step of providing a clad leadframe is further characterized as providing a clad leadframe having the first metal layer comprising a material selected from a group consisting of: nickel, iron, cobalt, copper, tin, chromium, and an alloy thereof.

11. The method of claim 7, wherein the step of providing a clad leadframe is further characterized as providing a clad leadframe having the second metal layer composing the plurality of bonding posts comprising a material selected from a group consisting of: aluminum cladding, copper cladding, silver cladding, and an alloy cladding thereof.

12. A method for making a semiconductor device, comprising the steps of:
    providing a clad leadframe which comprises:
        a plurality of leads arranged in a quad configuration composed of a first metal layer having a thickness substantially in a range of 0.10 to 0.15 millimeter, the plurality of leads having proximal ends to a central cavity for accommodating a semiconductor die; and
        a plurality of bonding posts composed of a second metal layer having a thickness substantially in a range of 0.05 to 0.15 millimeter which is clad on one surface of the first metal layer, wherein the plurality of bonding posts extends beyond the proximal ends of the plurality of leads of the first metal layer toward the central cavity;
    bonding a first portion of the clad leadframe to a periphery of a base member using a first seal, such that the plurality of leads and the plurality of bonding posts converge toward a central die receiving area on the base member, wherein a second portion of the clad leadframe extends beyond the periphery of the base member;
    mounting a semiconductor die to the base member in the central die receiving area;
    electrically connecting the semiconductor die to the plurality of bonding posts; and
    sealing a cover member to the base member with a second seal to form a package body around the semiconductor die.

13. The method of claim 12, further comprising the steps of:
    forming the second portion of the clad leadframe into a plurality of external leads;
    removing any portion of the second metal layer which is external to the package body; and
    plating the external leads after the step of removing.

14. The method of claim 12, wherein the step of removing comprises etching the second metal layer away from the second portion of the clad leadframe.

15. The method of claim 12, wherein the step of providing a clad leadframe is further characterized as providing a clad leadframe having the first metal layer comprising a material selected from a group consisting of: nickel, iron, cobalt, copper, tin, chromium, and an alloy thereof.

16. The method of claim 12, wherein the step of providing a clad leadframe is further characterized as providing a clad leadframe having the second metal layer composing the plurality of bonding posts comprising a material selected from a group consisting of: aluminum cladding, copper cladding, silver cladding, and an alloy cladding thereof.

* * * * *